US012808934B2

(12) United States Patent
Srinivasan et al.

(10) Patent No.: US 12,808,934 B2
(45) Date of Patent: Nov. 24, 2026

(54) METHOD TO TEST SYNCHRONOUS DOMAINS DURING STUCK-AT TEST

(71) Applicant: STMicroelectronics International N.V., Geneva (CH)

(72) Inventors: Venkata Narayanan Srinivasan, Greater Noida (IN); Ajay Kumar Dimri, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 531 days.

(21) Appl. No.: 18/236,038

(22) Filed: Aug. 21, 2023

(65) Prior Publication Data

US 2025/0070785 A1 Feb. 27, 2025

(51) Int. Cl.

| | |
|---|---|
| ***G01R 31/3185*** | (2006.01) |
| ***G01R 31/317*** | (2006.01) |
| ***G06F 1/06*** | (2006.01) |
| ***G06F 1/12*** | (2006.01) |

(52) U.S. Cl.

CPC ................ *G01R 31/318552* (2013.01); *G01R 31/31726* (2013.01); *G01R 31/31727* (2013.01); *G01R 31/318555* (2013.01); *G01R 31/318594* (2013.01); *G06F 1/06* (2013.01); *G06F 1/12* (2013.01)

(58) Field of Classification Search

CPC ........ G01R 31/31726; G01R 31/31727; G01R 31/318552; G01R 31/318555; G01R 31/318594; G06F 1/06; G06F 1/12

See application file for complete search history.

(56) References Cited

U.S. PATENT DOCUMENTS

| | | | |
|---|---|---|---|
| 8,775,857 | B2 | 7/2014 | Khullar et al. |
| 10,048,315 | B2 | 8/2018 | Srinivasan |
| 10,520,547 | B2 | 12/2019 | Sarda |

(Continued)

OTHER PUBLICATIONS

Bruder, Bertrand, et al.: "Using At-Speed Testing With OCC (On Chip Clock Control) on a Complex SoC, a User Experience," www.atmel.com, Jan. 1, 2013, 52 pgs.

(Continued)

*Primary Examiner* — Patrick O Neill

(74) *Attorney, Agent, or Firm* — Crowe & Dunlevy LLC

(57) ABSTRACT

A test-circuit includes a PLL-divider outputting first and third clock-signals as PLL clock-signals during functional mode and a capture-phase of transition and stuck-at-modes, and outputting a second clock-signal based upon an external clock-signal as an ATE clock-signal during a shift-phase of the transition and stuck-at-mode. An OCC passes the clock-signals in functional mode, transition capture mode, and stuck-at capture mode through sub-paths within first paths within first and second clock selection circuits so the first and third clock-signals are passed through less than the entire first paths, the sub-paths being first and second functional clock paths. In shift phase of transition and stuck-at-modes, the OCC passes the second clock-signal through sub-paths within second paths within the first and second clock selection circuits during the shift-phase so the second clock-signal is passed through less than the entire second paths, and through the first and second functional clock paths during the shift-phase.

12 Claims, 5 Drawing Sheets

(56) References Cited

U.S. PATENT DOCUMENTS

| | | | | |
|---|---|---|---|---|
| 11,714,131 | B1 * | 8/2023 | Srinivasan | G01R 31/318552 714/726 |
| 2009/0217112 | A1 | 8/2009 | Eckelman et al. | |
| 2012/0166860 | A1 | 6/2012 | Khullar et al. | |
| 2015/0137862 | A1 | 5/2015 | Bahl et al. | |
| 2015/0198663 | A1 | 7/2015 | Syed | |
| 2018/0080987 | A1 * | 3/2018 | Srinivasan | G01R 31/31724 |
| 2019/0120901 | A1 | 4/2019 | Chen et al. | |

OTHER PUBLICATIONS

Lin, Wei, et al.: "An On-Chip Clock Controller for Testing Fault in System on Chip," Proceedings of the 2nd International Conference on Computer Science and Electronics Engineering (ICCSEE 2013), Mar. 1, 2013, 4 pgs.
Synopsys: "DFT Compiler Scan User Guide," Version D-2010.03-SP2, Jun. 2010, 515 pgs.
EP Search Report and Written Opinion for counterpart EP Appl. No. 24181417.7, report dated Nov. 26, 2024, 12 pgs.

* cited by examiner

METHOD TO TEST SYNCHRONOUS DOMAINS DURING STUCK-AT TEST

TECHNICAL FIELD

This disclosure is directed to the field of design-for-test (DFT) IC chips and, in particular, to a DFT IC chip incorporating techniques to provide for equal clock paths during both at-speed capture and stuck-at capture.

BACKGROUND

Scan testing is a hardware-level technique used for assessing the functionality of integrated circuits (ICs). The IC 10, designed for scan testing and illustrated in FIG. 1, incorporates z scan chains 22. These scan chains 22 are sequences of flip flops with reconfigurable connections, serving standard roles within the IC 10, such as maintaining state information. In test mode, the IC 10 reconfigures these flip flops to form scan chains 22, enabling direct manipulation and monitoring of the states of the flip flops.

The process of scan-shifting involves shifting decompressed data from a scan de-compressor 21 into the scan chains 22. The scan compressor 23 compresses the output from the scan chains, allowing a snapshot of the internal state of the IC 10 to be captured and examined. This process is particularly useful in identifying manufacturing defects or design errors.

Two testing strategies applied in this context are stuck-at testing and transition testing. Stuck-at testing is designed to identify faults wherein a circuit node is permanently "stuck" at a logical zero or one due to manufacturing defects. This testing phase, referred to as stuck-at capture, uses a particular sequence of clock signals generated from clock bits CKBITS and a scan enable signal, driving the IC 10 into specific states for testing.

Conversely, transition testing is employed to detect faults that manifest when the circuit transitions from one state to another. This testing phase, known as at-speed capture, involves designed sequences of clock signals and scan enable signals to force transitions between different states and verify their correct operation.

The test clock TSTCLK synchronizes the scan chains 22 with the core logic of the IC 10 during testing. This test clock TSTCLK is generated by an on-chip clock controller (OCC) 11 from an automated test equipment (ATE) clock ATECLK and from a phase-locked loop clock PLLCLK. Based on the received clock bits CKBITS from a clock chain 13, the logic components of the OCC 11 are dynamically reconfigured to generate the test clock TSTCLK patterns used for both the stuck-at and transition testing phases. Changes in these clock bits CKBITS, in response to m clock chain input bits OCC[1], . . . , OCC[m] received from m pins, facilitate the generation of the required test clock signal patterns. This dynamic reconfiguration allows the OCC 11 to produce the desired test clock signal TSTCLK patterns, controlling the operation of the scan chains 22 and the core logic of the chip during the various testing phases.

FIG. 2 illustrates details of an example of a test circuit 1 for use in an IC designed for test, including the OCC 11 for asynchronous clock domains i.e., PLLCLKA and PLLCLKB are asynchronous, as are the outputs TSTCLKA and TSTCLKB of the test circuit.

FIG. 3 illustrates details of an example of a test circuit 1' for use in an IC designed for test, including the OCC 11'. In this example, the output clock CLK of the PLL 5 is passed to a divider block 82 which includes multiple division circuits (e.g., divide by 2, divide by 4, divide by 8, divide by 16) that provide divided versions of the passed PLL clock. During at-speed capture (transition testing), the phase lock loop (PLL) clock CLK generated by the PLL 5, and its divided output are routed through identical paths into the OCC 11 as PLLCLK[1] and PLLCLK[2], reaching the clock trees 41, 42 substantially simultaneously due to the balanced paths. This ensures the IC operates at its normal speed, capturing any faults that occur during state transitions.

However, during stuck-at capture (stuck-at testing), the slower ATE clock ATECLK is used. Notably, the path of the ATE clock ATECLK to the clock selection circuit 34 is shorter than its path to the clock selection circuit 32. Consequently, each pulse of the ATE clock ATECLK may reach the clock tree 42 before it reaches the clock tree 41, causing a timing imbalance that may result in inaccuracies in stuck-at fault detection.

This imbalance necessitates further development in the OCC or associated logic to ensure accurate and reliable clocking during both at-speed and stuck-at captures, optimizing the detection of potential faults during both transition and stuck-at testing phases.

SUMMARY

Disclosed herein is a test circuit in an integrated circuit (IC) designed for test, including a phase-locked loop circuit configured to: output a first clock signal, with the phase-locked loop circuit generating the first clock signal as a first PLL clock signal during functional mode, and during a capture phase of a transition mode, and with the phase-locked loop circuit outputting the first clock signal based upon an external clock signal as a first ATE clock signal (ATECLK_T_SC) during a capture phase of stuck-at mode. Phase phase-locked loop circuit is further configured to: output a second clock signal, based upon an external clock signal, as a second ATE clock signal (ATECLK) during a shift phase of the transition mode and the stuck-at mode.

An on-chip clock controller (OCC) is configured to receive the first clock signal and the second clock signal, and to pass the first clock signal and the second clock signal therethrough. A first clock tree is configured to receive the first clock signal and the second clock signal as passed by the OCC.

The OCC is configured to pass the first clock signal therethrough by: in the functional mode, transition capture mode, and stuck-at capture mode, passing the first clock signal through a sub-path within a first path within a first clock selection circuit in the OCC such that the first clock signal is passed through less than the entire first path within the first clock selection circuit, the sub-path within the first path within the first clock selection circuit being a first functional clock path. The OCC is configured to pass the second clock signal therethrough by: in transition scan-shift mode and stuck-at scan-shift mode, passing the second clock signal through a sub-path within a second path within the first clock selection circuit in the OCC during the shift phase of the transition mode and the stuck-at mode such that the second clock signal is passed through less than the entire second path within the first clock selection circuit, and passing the second clock signal through the sub-path within the first clock selection circuit, the sub-path within the first clock selection circuit being a first shift clock path, during the shift phase of the transition mode and the stuck-at mode.

The OCC is also configured to pass the second clock signal therethrough by, in the transition mode, passing the second clock signal through an entire second path within the first clock selection circuit in the OCC during the shift phase of the transition mode and passing the first clock signal through the entire first path within the first clock selection circuit in the OCC during the capture phase of the transition mode.

The phase-locked loop circuit may output the first clock signal to a divider, generating a third clock signal as a third PLL clock signal during functional mode and during a capture phase of a transition mode, and with the divider being bypassed when outputting the third clock signal based upon the external clock signal as a first ATE clock signal during a capture phase of the stuck-at mode. The OCC may be further configured to receive the third clock signal and to pass the third clock signal therethrough. A second clock tree may be configured to receive the third clock signal as passed by the OCC.

The OCC may be configured to pass the third clock signal therethrough by: in the functional mode, transition capture mode, and stuck-at capture mode, passing the third clock signal through a sub-path within a first path within a second clock selection circuit in the OCC such that the third clock signal is passed through less than the entire first path within the second clock selection circuit, the sub-path within the first path within the second clock selection circuit being a second functional clock path.

The OCC may be configured to pass the second clock signal therethrough by: in the transition scan-shift mode and stuck-at scan-shift mode, passing the second clock signal through a sub-path within the second path within the second clock selection circuit in the OCC during the shift phase of the transition and stuck-at mode such that the second clock signal is passed through less than the entire second path within the second clock selection circuit, and passing the second clock signal through the sub-path within the second clock selection circuit, the sub-path within the second clock selection circuit being a second shift clock path, during the shift phase of the transition mode and the stuck-at mode.

The phase-locked loop circuit and divider may also generate the first and third clock signals as first and second PLL clock signals during a capture phase of a transition mode, and output the first and third clock signals based upon the external clock signal as the first ATE clock signal during the capture phase of the stuck-at mode.

The OCC may also be configured to pass the first, second and third clock signals therethrough by, in the transition mode: passing the second clock signal through an entire second path within the first clock selection circuit in the OCC during the shift phase of the transition mode and passing the first clock signal through the entire first path within the first clock selection circuit in the OCC during the capture phase of the transition mode; and passing the second clock signal through an entire second path within the second clock selection circuit in the OCC during the shift phase of the transition mode and passing the third clock signal through the entire first path within the second clock selection circuit in the OCC during the capture phase of the transition mode.

The first clock selection circuit may include a first AND gate having a non-inverting input receiving a scan enable signal and an inverting input receiving an intermediate signal, a first flip flop having a data input receiving output from the first AND gate and a clock input receiving the second ATE clock signal, a second AND gate having a first non-inverting input receiving the scan enable signal and a second non-inverting input receiving output from the first flip flop, a first OR gate having a first non-inverting input receiving output from the second AND gate and a second non-inverting input receiving a bypass signal, a third AND gate having a first non-inverting input receiving output from the first OR gate and a second non-inverting input receiving a MUX output signal, a first latch having a data input receiving output from the third AND gate and a clock input receiving the external clock signal, a fourth AND gate having a first non-inverting input receiving output from the first latch and a second non-inverting input receiving the external clock signal, a fifth AND gate having a first inverting input receiving output from the first flip flop, a second inverting input receiving the scan enable signal, and a non-inverting input receiving a pipeline OR tree signal, a second flip flop having a data input receiving output from the fifth AND gate and a clock input receiving the first PLL clock signal, a sixth AND gate having a non-inverting input receiving output from the second flip flop and an inverting input receiving the bypass signal, a second OR gate having a non-inverting input receiving output from the sixth AND gate and an inverting input receiving a first MUX output signal, a second latch having a data input receiving output from the second OR gate and a clock input receiving the first PLL clock signal, a seventh AND gate having a first non-inverting input receiving output from the second latch and a second non-inverting input receiving the first PLL clock signal, a NAND gate having a first non-inverting input receiving the first MUX output signal and a second non-inverting input receiving the bypass signal, an eighth AND gate having a first non-inverting input receiving output from the seventh AND gate and a second non-inverting input receiving output from the NAND gate, and a third OR gate having a first non-inverting input receiving output from the fourth AND gate and a second non-inverting input receiving output from the eighth AND gate, with an output of the third OR gate being provided to the first clock tree as the first clock signal during capture and second clock signal during scan-shift, passed by the OCC. A multiplexer may have a first input receiving the scan enable signal and a second input, the multiplexer generating the first MUX output signal.

The multiplexer nay pass the scan enable signal during the stuck-at mode but otherwise passes a test controller bit during transition ATPG and a LBIST mode control signal during transition LBIST as a test mode signal at the output of multiplexer.

The scan enable signal may be asserted during the shift phase of the transition mode and during the shift phase of the stuck-at mode and deasserted during the capture phase of the transition mode and the capture phase of the stuck-at mode.

The bypass signal may be asserted during the stuck-at mode and deasserted during the transition and functional modes. The pipeline OR tree signal may be asserted at some time during the capture phase of the transition mode and deasserted during other modes. The test mode signal at the output of the multiplexer may be asserted during the transition mode and during the shift phase of the stuck-at mode but is deasserted during the capture phase of the stuck-at mode and functional mode.

The second clock selection circuit may include a first AND gate having a non-inverting input receiving the scan enable signal and an inverting input receiving a second intermediate signal, a first flip flop having a data input receiving output from the first AND gate and a clock input receiving the second ATE clock signal, a second AND gate having a first non-inverting input receiving the scan enable signal and a second non-inverting input receiving output from the first flip flop, a first OR gate having a first non-inverting input receiving output from the second AND gate and a second non-inverting input receiving the bypass signal, a third AND gate having a first non-inverting input receiving output from the first OR gate and a second non-inverting input receiving a first MUX output signal, a first latch having a data input receiving output from the third AND gate and a clock input receiving the external clock signal, a fourth AND gate having a first non-inverting input receiving output from the first latch and a second non-inverting input receiving the external clock signal, a fifth AND gate having a first inverting input receiving output from the first flip flop, a second inverting input receiving the scan enable signal, and a non-inverting input receiving the pipeline OR tree signal, a second flip flop having a data input receiving output from the fifth AND gate and a clock input receiving the second PLL clock signal, a sixth AND gate having a non-inverting input receiving output from the second flip flop and an inverting input receiving the bypass signal, a second OR gate having a non-inverting input receiving output from the sixth AND gate and an inverting input receiving the first MUX output signal, a second latch having a data input receiving output from the second OR gate and a clock input receiving the second PLL clock signal, a seventh AND gate having a first non-inverting input receiving output from the second latch and a second non-inverting input receiving the second PLL clock signal, a NAND gate having a first non-inverting input receiving the first MUX output signal and a second non-inverting input receiving the bypass signal, an eighth AND gate having a first non-inverting input receiving output from the seventh AND gate and a second non-inverting input receiving output from the NAND gate, and a third OR gate having a first non-inverting input receiving output from the fourth AND gate and a second non-inverting input receiving output from the eighth AND gate, with an output of the third OR gate being provided to the second clock tree as the third clock signal during capture and the second clock signal during scan-shift signal passed by the OCC.

Also disclosed herein is a method for maintaining a balanced clock signal path when a test select mode signal is at a logic low across different operation modes in an integrated circuit. The method includes outputting first and third clock signals from a phase-locked loop (PLL) circuit and a divider circuit respectively. The methods also includes in a functional mode, a transition capture mode, and a stuck-at capture mode routing the first and third clock signals through an on-chip clock controller (OCC) by: passing the first clock signal through a sub-path within a first path within a first clock selection circuit such that the first clock signal is passed through less than the entire first path within the first clock selection circuit, the sub-path within the first path within the first clock selection circuit being a first functional clock path, and passing the third clock signal through a sub-path within a first path within a second clock selection circuit such that the third clock signal is passed through less than the entire first path within the second clock selection circuit, the sub-path within the first path within the second clock selection circuit being a second functional clock path. In a transition shift mode and stuck-at shift mode, the method includes routing the second clock signals through the OCC by: passing the second clock signal through a sub-path within the second path within the first clock selection circuit during a shift phase of the transition and stuck-at mode such that the second clock signal is passed through less than the entire second path within the first clock selection circuit, and passing the second clock signal through the first functional clock path during a shift phase of the transition and stuck-at mode, and passing the second clock signal through a sub-path within the second path within the second clock selection circuit during the shift phase of the transition and stuck-at mode such that the second clock signal is passed through less than the entire second path within the second clock selection circuit, and passing the second clock signal through the second functional clock path during the shift phase of the transition and stuck-at mode. The method further includes distributing the first clock signal and second clock signal to a first clock tree after the first clock signal and second clock signal has been routed through the OCC, and distributing the third and second clock signal to a second clock tree after the third and second clock signal has been routed through the OCC.

The first clock signal may be a PLL clock signal generated by the PLL circuit or an Automatic Test Equipment (ATE) clock signal (ATE_T_SC) passed through the PLL circuit when a bypass signal is set to a logic one.

The method may also include generating the first clock signal as a first PLL clock signal by the PLL circuit during functional mode and during a capture phase of a transition and stuck-at mode; and generating the second clock signal based upon an external clock signal as a second ATE clock signal (ATECLK) during a shift phase of the transition and stuck-at mode, and generating the third clock signal as a second PLL clock signal by the divider circuit during functional mode and during a capture phase of transition and stuck-at modes; and generating the second clock signal based upon the external clock signal as a second ATE clock signal during the shift phase of the transition and stuck-at modes.

The method may further include passing the second clock signal through the OCC in the transition mode by passing the second clock signal through an entire second path within the first clock selection circuit during the shift phase of the transition mode and passing the first clock signal through the entire first path within the first clock selection circuit during the capture phase of the transition mode, and passing the second clock signal through the OCC in the transition mode by passing the second clock signal through an entire second path within the second clock selection circuit during the shift phase of the transition mode and passing the third clock signal through the entire first path within the second clock selection circuit during the capture phase of the transition mode.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Figure 1:
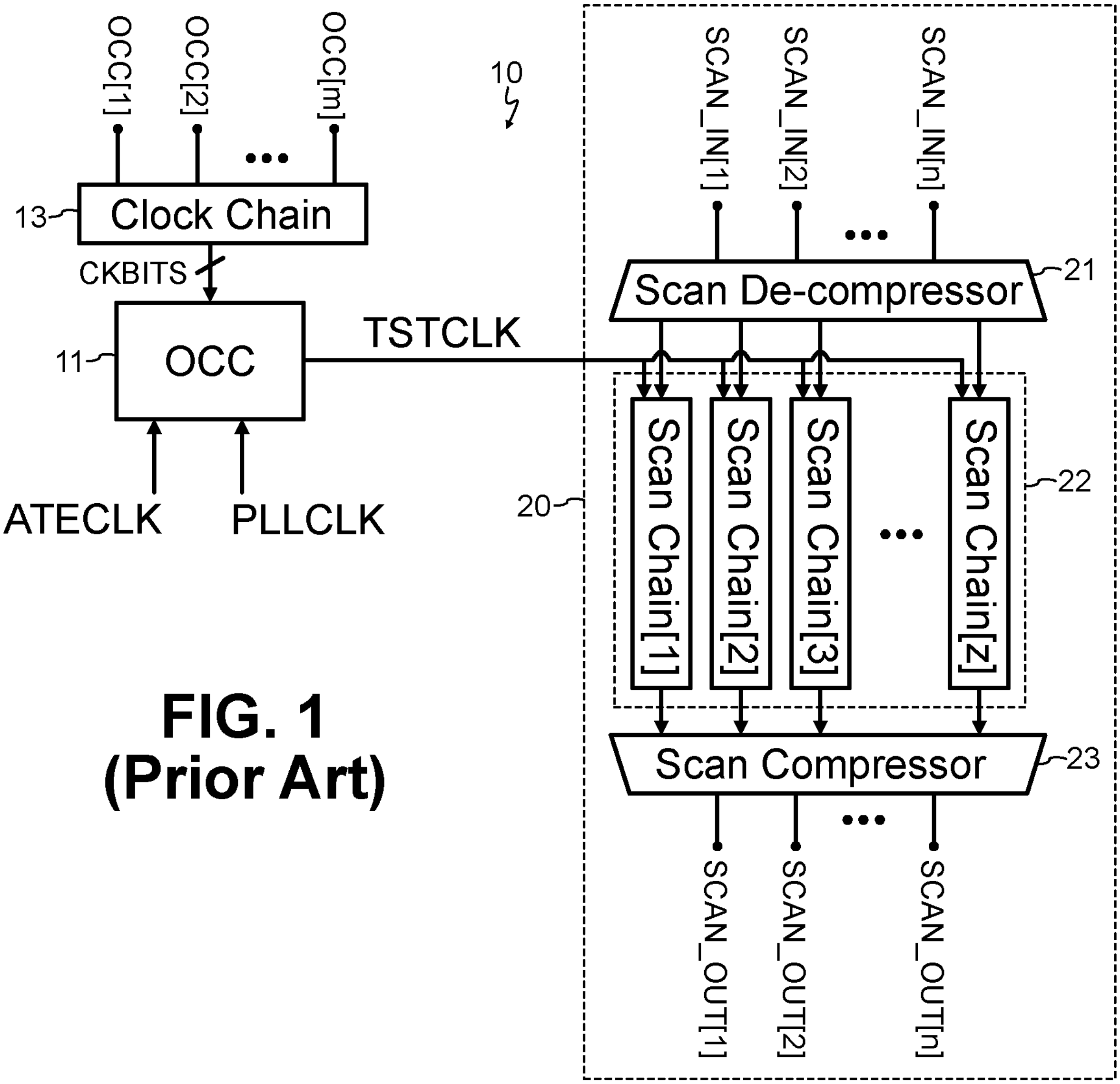
FIG. 1 (Prior Art)
FIG. 1 is a block diagram of a conventional integrated circuit (IC) designed for test.
Figure 2:
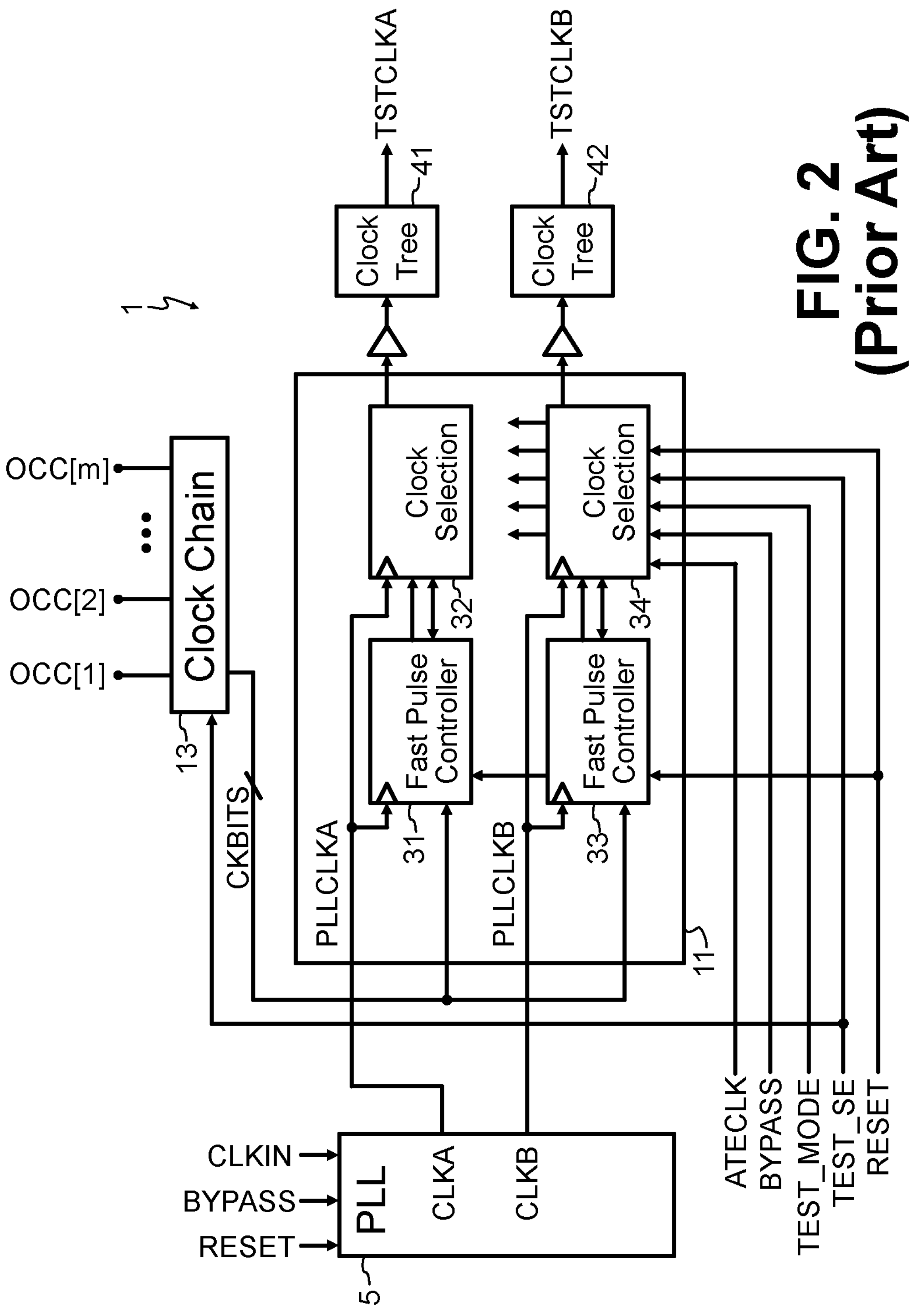
FIG. 2 (Prior Art)
FIG. 2 is a block diagram of a conventional test circuit for use in an IC designed for test, the test circuit including an on-chip clock controller (OCC) for asynchronous clock domains.
Figure 3:
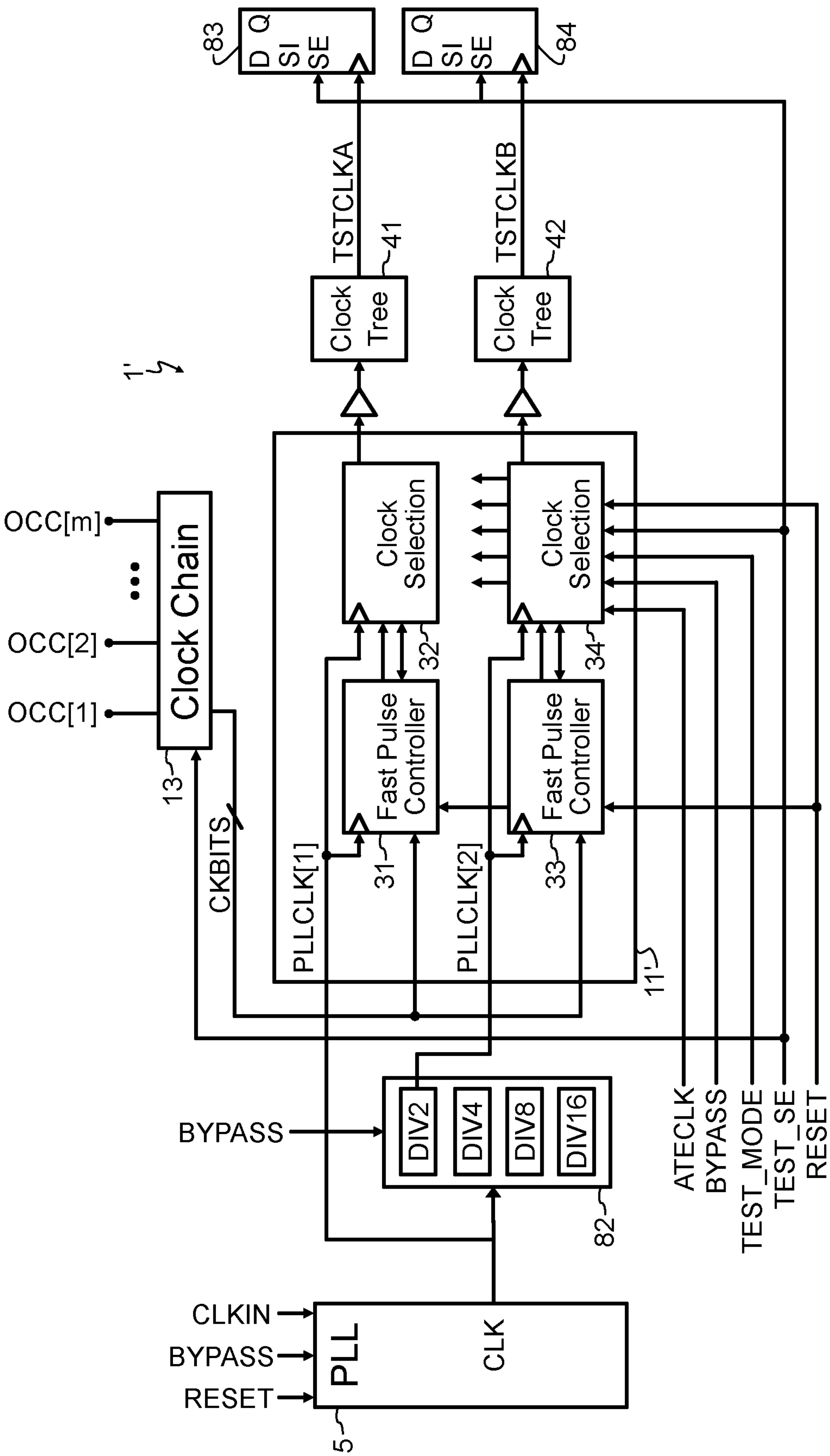
FIG. 3 (Prior Art)
FIG. 3 is a block diagram of a conventional test circuit for use in an IC designed for test, the test circuit including an on-chip clock controller (OCC) for synchronous clock domains.
Figure 4:
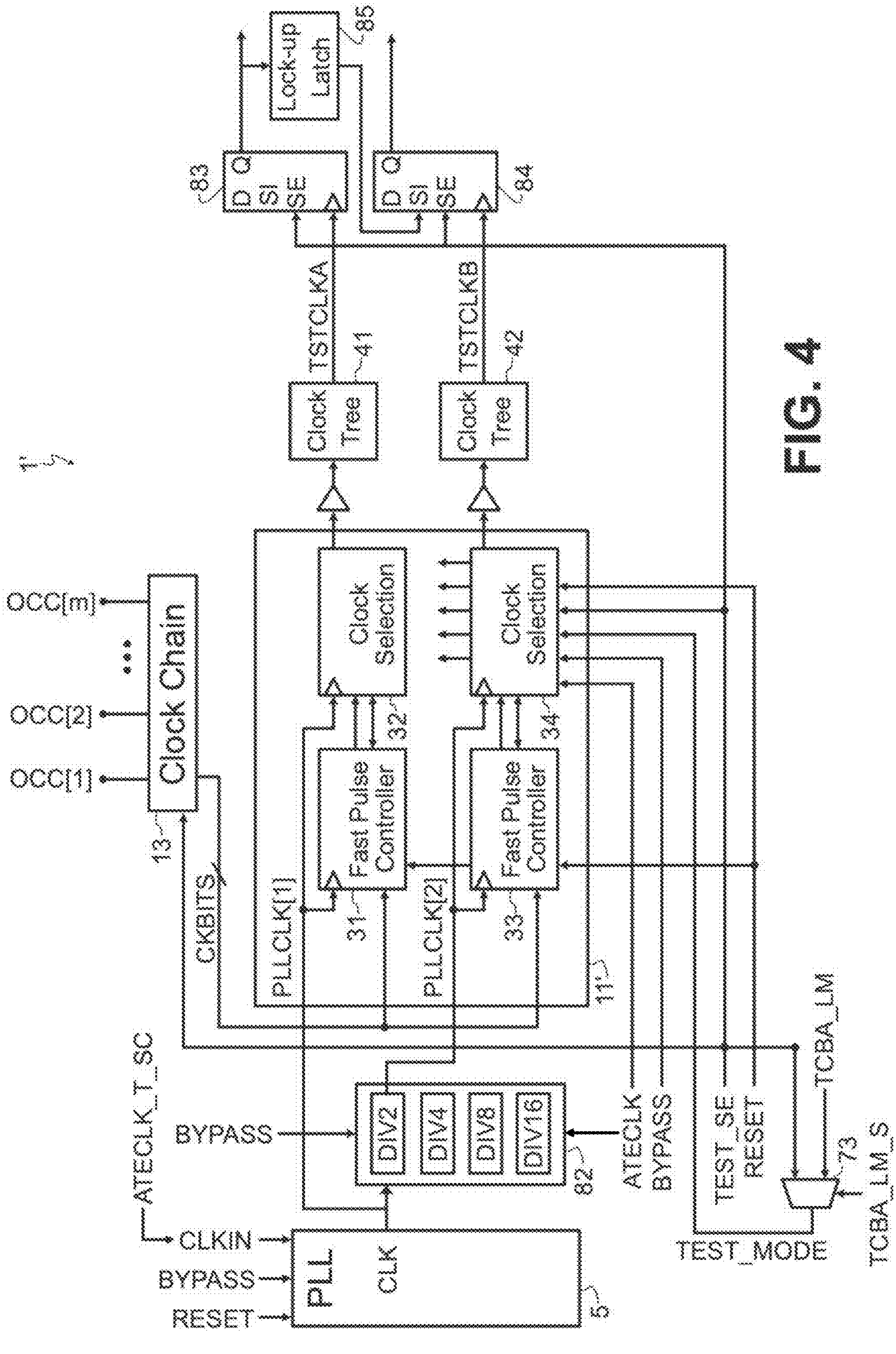
FIG. 4 is a test circuit for use in an IC designed for test, the test circuit including an on-chip clock controller (OCC) for synchronous clock domains.

Now described with reference to FIG. 4 is a modified test circuit 1' including a modified OCC 11'. Similarly to FIG. 3, in this example, the output clock CLK of the PLL 5 is passed to a divider block 82 including multiple division circuits that provide divided versions of the passed PLL clock. The clock selection blocks 32 and 34 during both transition scan-shift and stuck-at scan shift will continue to be clocked from ATE clock ATECLK, which reaches these blocks directly from automated test equipment (ATE). Lock-up latches 85 are present between the Q output of the scan flop 83 and the SI input of the scan flop 84 when the scan flop 84 is clocked by the clock TSTCLKB connected in same scan chain next to scan flop 83 clocked by TSTCLKA. This serves to remove timing imbalance inaccuracies in the scan-shift path. As compared to FIG. 3, in this embodiment of FIG. 4, the clock selection blocks 32 and 34 during both transition capture and stuck-at capture are always clocked through the PLL 5, whether that be by the PLL clock generated as CLK when the bypass signal BYPASS is at a logic zero or by the ATE clock ATECLK_T_SC passed to the clock input CLKIN of the PLL 5 when the bypass signal BYPASS is at a logic one.

Indeed, the aim of the modified OCC 11' is to keep the scan-shift path balanced from the ATECLK to the clock trees 41 and 42, and keep the scan capture path balanced from the PLL clock itself or from ATE_CLK_T_SC (routed through the PLL 5). In each capture mode, the clock signal flows through the PLL 5. It may either be the PLL clock PLLCLK itself or the ATE clock ATECLK_T_SC that is routed through the PLL when the PLL bypass signal BYPASS signal is set to a logic one. The clock signal is then passed from the PLL 5, through the OCC 11' (specifically through the fast pulse controllers 31 and 33 and the clock selection circuits 32 and 34) to the clock trees 41, 42. By maintaining balanced same clock path in each capture mode, the need for additional circuitry to manage potential timing issues that could arise if the clock paths through controllers 31 and 33 and the clock selection circuits 32 and 34 became unbalanced depending on the mode of operation is eliminated. This provides for space savings without degradation of reliability.

Figure 5:
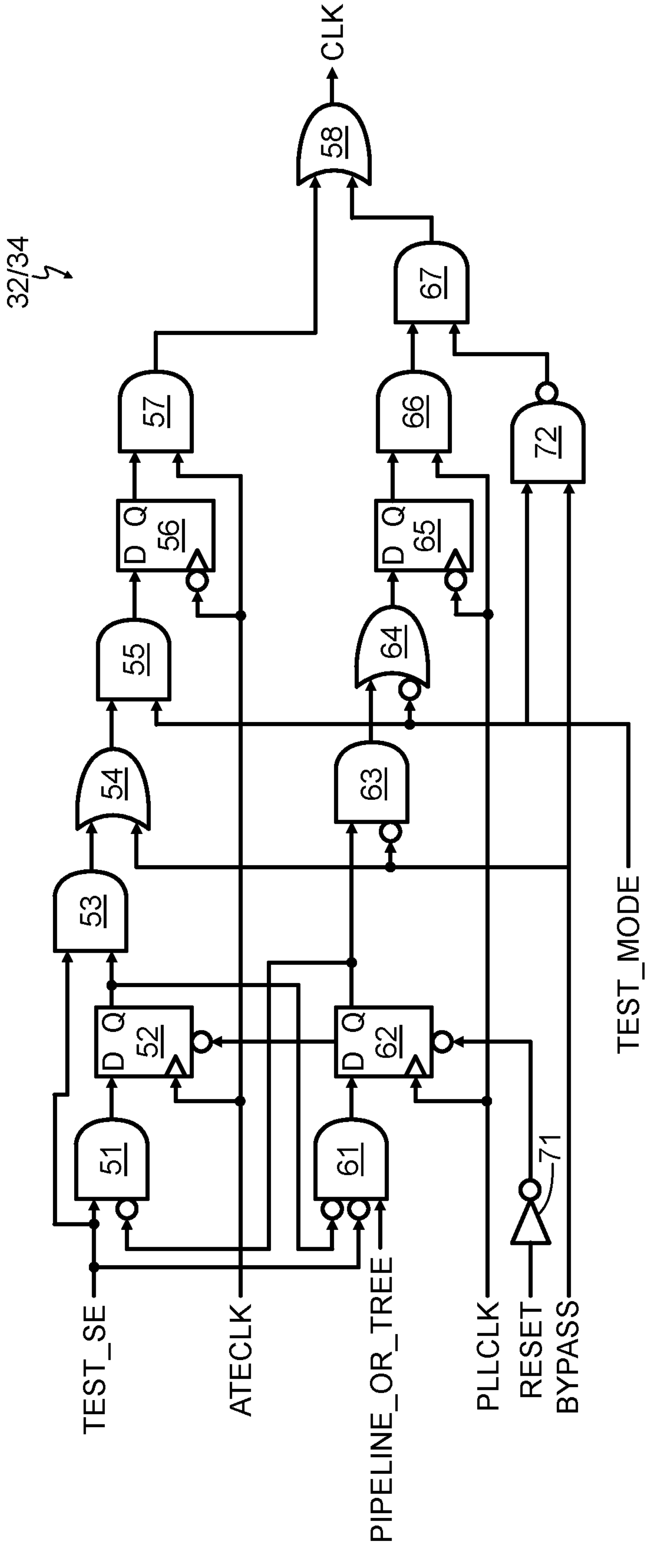
FIG. 5 is a block diagram of a clock selection block for use in the OCC of FIG. 4.

Now described with reference to FIG. 5 is the clock selection circuit 32 or 34 usable in the OCC 11' of FIG. 4 in order to provide for balanced clock paths regardless of whether operation is in at-speed capture or stuck-at capture. Before, however, note the presence of the multiplexer 73 in FIG. 4 (which is not present in FIG. 3). The multiplexer 73 has a first input connected to the test select signal TEST_SE, a second input driven from a test controller bit in ATPG and a LBIST mode control signal from a LBIST controller in LBIST mode (collectively represented as TCBA_LM), an output test mode signal TESTMODE entering OCC 11' and clock selection circuits 32, and 34. The multiplexer 73 has a selection input connected to receive the stuck-at mode signal STUCK_AT_MODE driven from another Test controller bit in ATPG and another LBIST mode control signal from the LBIST controller in the LBIST mode.

The clock selection circuit 32 or 34 includes a first AND gate 51 having an input receiving a test select signal TEST_SE, an inverting input (e.g., inverter in series with an input) receiving the output of flip flop 62, and an output. A flip flop 52 has a data input connected to receive the output of the AND gate 51, a clock input connected to receive the ATE clock signal ATECLK, an inverting reset input (e.g., inverter in series with a reset input) configured to receive the inverse of the reset signal RESET, and an output. An AND gate 53 has a first input connected to receive the test select signal TEST_SE, a second input connected to receive the output of the flip flop 52, and an output. An OR gate 54 has a first input connected to receive the output of the AND gate 53, a second input connected to receive the bypass signal BYPASS, and an output. An AND gate 55 has a first input connected to receive the output of the OR gate 54, a second input connected to receive the output of the multiplexer 73, and an output. A latch 56 has a data input connected to receive the output of the AND gate 55, an inverting clock input (e.g., inverter in series with a clock input) connected to receive the ATE clock ATECLK, and an output. An AND gate 57 has a first input connected to receive the output of the latch 56, a second input connected to receive the ATE clock ATECLK, and an output.

The clock selection circuit 32 or 34 also includes an AND gate 61 having a first inverting input connected to receive the output of the flip flop 52, a second inverting input connected to receive the test select signal TEST_SE, an input connected to receive the pipeline_or_tree signal PIPELINE_OR_TREE, and an output. Note that PIPELINE_OR_TREE is output by the fast pulse controller 31 or 33 based upon the clock bits CKBITS, ultimately providing the required number of at-speed pulses of CLK (output by OR gate 58, described below).

A flip flop 62 has a data input connected to receive the output of the AND gate 61, a clock input connected to receive the PLL clock signal PLLCLK (CLK output as generated by the PLL 5 or the DIV2 output from divider block 82), an inverting reset input (e.g., inverter in series with a reset input) connected to receive an inverted version of the reset signal RESET, and an output. An AND gate 63 has an input connected to receive the output of the flip flop 62, an inverting input (e.g., inverter in series with an input) connected to receive the bypass signal BYPASS, and an output. An OR gate 64 has an input connected to receive the output of the AND gate 63, an inverting input (e.g., inverter in series with an input) connected to receive the output of the multiplexer 73, and an output. A latch 65 has a data input connected to receive the output of OR gate 64, an inverting clock input (e.g., inverter in series with a clock input) connected to receive the PLL clock signal PLLCLK, and an output. An AND gate 66 has a first input connected to receive the output of the latch 65, a second input connected to receive the PLL clock signal PLLCLK, and an output. An AND gate 67 has a first input connected to receive the output of the AND gate 66, a second input connected to receive the output of the NAND gate 72, and an output. An OR gate 58 has a first input connected to receive the output of the AND gate 57, a second input connected to receive the output of the AND gate 67, and an output producing a clock signal CLK that is ultimately passed to the clock trees 41 and 42 to produce the test clocks TSTCLKA, TSTCLKB.

The NAND gate 72 has a first input connected to receive the output of the multiplexer 73, a second input connected to receive the bypass signal BYPASS, and an output connected to the second input of the AND gate 67. The reset signal RESET is inverted by the inverter 71 and provided to the inverting reset inputs of the flip flops 62 and 52.

The output of the multiplexer 73 is connected to the first input of the NAND gate 72, the inverting input of the OR gate 64, and the second input of the AND gate 55.

A. Functional Mode Operation

First consider the operation of the circuit in functional mode, as opposed to test mode. In this mode, the STUCK_AT_MODE signal is a logic zero (TCBA_LM_S='0'), directing the multiplexer 73 to deliver TCBA_LM to the test mode signal TEST_MODE as its output. As the TEST_MODE is set to logic zero in functional mode (as TCBA_LM='0'), the multiplexer 73 consequently passes a logic zero. This triggers the NAND gate 72 and the OR gate 64 to both output a logic one. When PLLCLK is a logic zero, the Q output of the latch 65 will be a logic one and then will remain a logic one thereafter. This enables thereby enabling the output of AND gate 66 to align with the PLL clock PLLCLK. It is worth noting at this stage, with TEST_MODE at logic zero, AND gate 55 delivers a logic zero, effectively barring the passage of any logic one from that part of the circuit. As a result, in functional mode, the output CLK of OR gate 58 aligns exclusively with the PLL clock PLLCLK.

B. Transition Mode Operation, Shift

Now, transition mode will be discussed. Here, the test mode signal TEST_MODE transitions to a logic one during shift (as TCBA_LM='1') and BYPASS is at a logic zero. Given that the STUCK_AT_MODE signal remains at a logic zero in this mode (as TCBA_LM_S='0'), the multiplexer 73 continues to output TCBA_LM to the test mode signal TEST_MODE.

When scan enable TEST_SE switches to logic one during shift, the output of AND gate 61 becomes logic zero because TEST_SE is connected to an inverting input (e.g., inverter in series with an input) of the AND gate 61. This subsequently sets the output of flip flop 62 to logic zero, enabling AND gate 51 to receive two logic ones at its inputs (TEST_SE at its input, and the logic zero from flip flop 62 at its inverting input) and therefore output a logic one to flip flop 52. Upon the arrival of the next ATE clock signal ATECLK pulse, flip flop 52 outputs this logic one, causing the output of AND gate 53 output to transition to logic one. The output of OR gate 54 is therefore at a logic one. Consequently, with multiplexer 73 outputting the test mode signal TEST_MODE, AND gate 55 mimics the output of OR gate 54. When the ATECLK is logic zero, the output of the latch 56 follows that of AND gate 55 and will remain with that value thereafter, thereby enabling the output of AND gate 57 to align with the ATE clock ATECLK.

Note here that, due to TEST_SE being at logic one, the output of flip flop 62 stays at logic zero, causing the output of AND gate 63 to transition to logic zero. Furthermore, as TEST_MODE is at logic one at the inverting input of OR gate 64, the output of OR gate 64 remains at logic zero. This state keeps the output of latch 65 at logic zero, causing AND gates 66 and 67 to maintain their outputs at logic zero. Therefore, in transition mode during scan-shift, the output CLK of OR gate 58 aligns exclusively with the ATE clock signal ATECLK. The resulting test clocks TSTCLKA, TSTCLKB generated may be passed as clock inputs to scan flops 83 and 84 with lock-up latch 85 connected between the Q output of the scan flop 83 to SI input of the scan flop 84 when the scan flop 84 is clocked by TSTCLKB connected in the same scan chain next to the scan flop 83 clocked by TSTCLKA.

C. Transition Mode Operation, Capture

During capture, the test enable signal TEST_SE switches to a logic zero. This deactivation of TEST_SE causes AND gate 61 to output a logic one, when the pipeline_or_tree signal PIPELINE_OR_TREE is active.

This logic one output by the OR gate 61 is then passed to flip flop 62, and upon the arrival of the next PLL clock signal PLLCLK pulse, the output of flip flop 62 switches to a logic one.

Simultaneously, TEST_SE being a logic zero causes the output of AND gate 51 to go to a logic zero. Consequently, the output of flip flop 52 remains at a logic zero upon the arrival of the next ATE clock signal ATECLK pulse. This causes AND gate 53, and therefore OR gate 54 and AND gate 55, to maintain their outputs at logic zero. As a result, latch 56 and AND gate 57 also output a logic zero.

On the other hand, as the output of flip flop 62 is now a logic one and BYPASS is a logic zero, the output of AND gate 63 goes to a logic one. Thus, the output of OR gate 64 follows the output of AND gate 63. When PLLCLK is a logic zero, the Q output of the latch goes to a logic one and will then remain at a logic one thereafter until PIPELINE_OR_TREE becomes a logic zero with TEST_SE being a logic zero. This causes AND gate 66 to provide the required number of PLLCLK pulses. Given that NAND gate 72 is outputting a logic one, AND gate 67 also follows the AND gate 66 (restricting the number of PLLCLK pulses based on PIPELINE_OR_TREE value).

As a result, during the capture mode, the output CLK of OR gate 58 aligns exclusively with the PLL clock signal PLLCLK for a restricted time based on the value of PIPELINE_OR_TREE, as it combines the outputs of AND gate 57 (now at a logic zero) and AND gate 67 (following the PLL clock signal, controlled by the PIPELINE_OR_TREE value).

D. Stuck-At Mode Operation, Shift

Stuck-at testing is now described. In this mode, the dividers of the divider block 82 can be bypassed such that clock passed thereto by the PLL 5 is output at each output of the divider block 82 without division having been performed. During stuck at testing, the STUCK_AT_MODE signal is asserted, causing the multiplexer 73 to pass the scan enable signal TEST_SE as its TESTMODE output.

During the shift phase of stuck-at testing, TEST_SE is at logic one and the bypass signal BYPASS is also at logic one.

As the NAND gate 72 has one input at logic one from multiplexer 73 and another input from the bypass signal BYPASS at logic one, the output of the NAND gate 72 becomes a logic zero. This sets the input condition of AND gate 67 such that it blocks, outputting a logic zero.

Simultaneously, BYPASS being at logic one causes OR gate 54 to output a logic one, since BYPASS is connected to the second input of OR gate 54. TEST_SE is also a logic one during the shift phase, leading AND gate 55 to have two logic ones at its inputs, thereby outputting a logic one. When the ATE clock signal ATECLK is a logic zero, the latch 56 outputs this logic one and will remain logic one thereafter, causing AND gate 57 to output a logic one when ATECLK is also at logic one (aligned with the ATE clock ATECLK).

In contrast, AND gate 67 remains at logic zero due to BYPASS being logic one and TEST_MODE as output by the multiplexer 73 being logic one to force the output of the NAND gate 72 to logic zero, which in turn forces the output of the AND gate 67 to logic zero.

Therefore, during the shift phase of stuck-at testing, the output CLK of OR gate 58 follows the ATE clock signal ATECLK due to AND gate 57 outputting a logic one and AND gate 67 outputting a logic zero. The resulting test clocks TSTCLKA, TSTCLKB generated may be passed as clock inputs to scan flops 83 and 84 with the lock-up latch 85 being connected between the Q output of the scan flop 83 and the SI input of scan flop 84 when the scan flop 84 is clocked by TSTCLKB and connected in same scan chain next to the scan flop 83 clocked by TSTCLKA.

E. Stuck-At Mode Operation, Capture

During the capture phase of stuck-at testing, the test enable signal TEST_SE switches to logic zero. As a consequence, NAND gate 72 outputs a logic one. However, with TEST_SE now at logic zero and being passed to the inverting input of OR gate 64, the output of OR gate 64 switches to logic one. This state causes the output of latch 65 to follow the PLL clock signal PLLCLK, and in turn, AND gate 66 also follows the PLL clock PLLCLK. As AND gate 67 receives a logic one at each input, it also outputs a signal that aligns with the PLL clock PLLCLK. However, due to TEST_SE being at logic zero during capture, AND gate 55 blocks the signal, leading AND gate 57 to output a logic zero. As a result, during the capture phase, the output CLK of OR gate 58 aligns exclusively with the PLL clock signal PLLCLK. Since the dividers 82 are bypassed and PLL 5 is bypassed, the ATE clock ATECLK_T_SC passed thereto by the PLL 5 is output at each output of the divider block 82 without the division having been performed, and is available at PLLCLK and at the OR gate 58 output CLK.

F. Benefits

Through the above-described OCC 11' and associated circuitry, the issues faced by the prior art have been solved. The same clock path is utilized in all modes done with TEST_SE being a logic zero regardless of whether operation is in functional mode, transition capture testing mode, or stuck-at capture testing mode, eliminating concerns of timing issues while saving area and complexity over prior art solutions employing different solutions such as modification of certain clock path lengths. Moreover, since the pulses output by the clock selection circuits 32 and 34 are aligned, circuitry such as a one-hot decoder to correct for misaligned pulses are not necessary, saving area, complexity, and pattern time increase.

In addition, since the functional path through the PLL 5 is taken, with the ATECLK_T_SC being passed through the PLL 5 via being input to the clock input CLKIN, controllability is maintained since the output is not limited to frequencies and duty cycle generatable by the PLL 5 circuitry. Moreover, the dividers of the divider block 82 can be bypassed during stuck-at testing, as stated, so that the flip flops therein may be used as part of the scan chains.

It is evident that modifications and variations can be made to what has been described and illustrated herein without departing from the scope of this disclosure.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. A test circuit in an integrated circuit (IC) designed for test, comprising:

a phase-locked loop circuit comprising a phase-locked loop (PLL) and a divider block, the phase-locked loop circuit configured to:

output a first clock signal, with the phase-locked loop circuit generating the first clock signal as a first PLL clock signal during a functional mode, and during a capture phase of a transition mode, and with the phase-locked loop circuit outputting the first clock signal based upon an external automated test equipment (ATE) clock signal as a first ATE clock signal during a capture phase of a stuck-at mode; and output a second clock signal, based upon the external ATE clock signal, as a second ATE clock signal during a shift phase of the transition mode and a shift phase of the stuck-at mode;

an on-chip clock controller (OCC) configured to receive the first clock signal and the second clock signal, and to pass the first clock signal and the second clock signal therethrough; and a first clock tree configured to receive the first clock signal and the second clock signal as passed by the OCC;

wherein the OCC is configured to pass the first clock signal therethrough by:

when in the functional mode, the capture phase of the transition mode, and the capture phase of the stuck-at mode:

passing the first clock signal through a first sub-path within a first path within a first clock selection circuit in the OCC such that the first clock signal is passed through less than the entire first path within the first clock selection circuit, the first sub-path within the first path within the first clock selection circuit being a first functional clock path; and wherein the OCC is configured to pass the second clock signal therethrough by:

when in the shift phase of the transition mode and the shift phase of the stuck-at mode:

passing the second clock signal through a second sub-path within a second path within the first clock selection circuit in the OCC such that the second clock signal is passed through less than the entire second path within the first clock selection circuit, the second sub-path within the first clock selection circuit being a first shift clock path.

2. The test circuit of claim 1, wherein the phase-locked loop circuit outputs the first clock signal to a divider, generating a third clock signal as a third PLL clock signal during the functional mode and during the capture phase of the transition mode, and with the divider being bypassed when outputting the third clock signal based upon the external ATE clock signal as the first ATE clock signal during the capture phase of the stuck-at mode;

wherein the OCC is further configured to receive the third clock signal and to pass the third clock signal therethrough;

further comprising a second clock tree configured to receive the third clock signal as passed by the OCC; and wherein the OCC is configured to pass the third clock signal therethrough by:

when in the functional mode, the capture phase of the transition mode, and the capture phase of the stuck-at mode, passing the third clock signal through a first sub-path within a first path within a second clock selection circuit in the OCC such that the third clock signal is passed through less than the entire first path within the second clock selection circuit, the first sub-path within the first path within the second clock selection circuit being a second functional clock path; and wherein the OCC is configured to pass the second clock signal therethrough by:

when in the shift phase of the transition mode and the shift phase of the stuck-at mode, passing the second clock signal through a second sub-path within a second path within the second clock selection circuit in the OCC during the shift phase of the transition mode and the shift phase of the stuck-at mode such that the second clock signal is passed through less than the entire second path within the second clock selection circuit, the second sub-path within the second clock selection circuit being a second shift clock path.

3. The test circuit of claim 2, wherein the phase-locked loop circuit and divider also generate the first and third clock signals as first and second PLL clock signals during the capture phase of the transition mode, and output the first and third clock signals based upon the external ATE clock signal as the first ATE clock signal during the capture phase of the stuck-at mode.

4. The test circuit of claim 3, wherein the first clock selection circuit comprises:

a first AND gate having a non-inverting input receiving a scan enable signal and an inverting input receiving an intermediate signal;

a first flip flop having a data input receiving output from the first AND gate and a clock input receiving the second clock signal;

a second AND gate having a first non-inverting input receiving the scan enable signal and a second non-inverting input receiving output from the first flip flop;

a first OR gate having a first non-inverting input receiving output from the second AND gate and a second non-inverting input receiving a bypass signal;

a third AND gate having a first non-inverting input receiving output from the first OR gate and a second non-inverting input receiving a first MUX output signal;

a first latch having a data input receiving output from the third AND gate and a clock input receiving the second clock signal;

a fourth AND gate having a first non-inverting input receiving output from the first latch and a second non-inverting input receiving the second clock signal;

a fifth AND gate having a first inverting input receiving output from the first flip flop, a second inverting input receiving the scan enable signal, and a non-inverting input receiving a pipeline OR tree signal;

a second flip flop having a data input receiving output from the fifth AND gate and a clock input receiving the first PLL clock signal;

a sixth AND gate having a non-inverting input receiving output from the second flip flop and an inverting input receiving the bypass signal;

a second OR gate having a non-inverting input receiving output from the sixth AND gate and an inverting input receiving the first MUX output signal;

a second latch having a data input receiving output from the second OR gate and a clock input receiving the first PLL clock signal;

a seventh AND gate having a first non-inverting input receiving output from the second latch and a second non-inverting input receiving the first PLL clock signal;

a NAND gate having a first non-inverting input receiving the first MUX output signal and a second non-inverting input receiving the bypass signal;

an eighth AND gate having a first non-inverting input receiving output from the seventh AND gate and a second non-inverting input receiving output from the NAND gate;

a third OR gate having a first non-inverting input receiving output from the fourth AND gate and a second non-inverting input receiving output from the eighth AND gate, with an output of the third OR gate being provided to the first clock tree as the first clock signal during capture and second clock signal during scan-shift, passed by the OCC; and a multiplexer having a first input receiving the scan enable signal and a second input, the multiplexer generating the first MUX output signal.

5. The test circuit of claim 4, wherein the multiplexer passes the scan enable signal during the stuck-at mode but otherwise passes a test controller bit during transition automated test pattern generation (ATPG) and a logic built-in self test (LBIST) mode control signal during transition LBIST as a test mode signal at the output of multiplexer;

wherein the scan enable signal is asserted during the shift phase of the transition mode and during the shift phase of the stuck-at mode and deasserted during the capture phase of the transition mode and the capture phase of the stuck-at mode;

wherein the bypass signal is asserted during the stuck-at mode and deasserted during the transition mode and the functional mode;

wherein the pipeline OR tree signal is asserted at some time during the capture phase of the transition mode and deasserted during other modes; and wherein the test mode signal at the output of the multiplexer is asserted during the transition mode and during the shift phase of the stuck-at mode but is deasserted during the capture phase of the stuck-at mode and the capture phase of the functional mode.

6. The test circuit of claim 5, wherein the second clock selection circuit comprises:

a first AND gate of the second clock selection circuit having a non-inverting input receiving the scan enable signal and an inverting input receiving a second intermediate signal;

a first flip flop of the second clock selection circuit having a data input receiving output from the first AND gate of the second clock selection circuit and a clock input receiving the second clock signal;

a second AND gate of the second clock selection circuit having a first non-inverting input receiving the scan enable signal and a second non-inverting input receiving output from the first flip flop of the second clock selection circuit;

a first OR gate of the second clock selection circuit having a first non-inverting input receiving output from the second AND gate of the second clock selection circuit and a second non-inverting input receiving the bypass signal;

a third AND gate of the second clock selection circuit having a first non-inverting input receiving output from the first OR gate of the second clock selection circuit and a second non-inverting input receiving the first MUX output signal;

a first latch of the second clock selection circuit having a data input receiving output from the third AND gate and a clock input receiving the second clock signal;

a fourth AND gate of the second clock selection circuit having a first non-inverting input receiving output from the first latch of the second clock selection circuit and a second non-inverting input receiving the second clock signal;

a fifth AND gate of the second clock selection circuit having a first inverting input receiving output from the first flip flop of the second clock selection circuit, a second inverting input receiving the scan enable signal, and a non-inverting input receiving the pipeline OR tree signal;

a second flip flop of the second clock selection circuit having a data input receiving output from the fifth AND gate of the second clock selection circuit and a clock input receiving the second PLL clock signal;

a sixth AND gate of the second clock selection circuit having a non-inverting input receiving output from the second flip flop of the second clock selection circuit and an inverting input receiving the bypass signal;

a second OR gate of the second clock selection circuit having a non-inverting input receiving output from the sixth AND gate of the second clock selection circuit and an inverting input receiving the first MUX output signal;

a second latch of the second clock selection circuit having a data input receiving output from the second OR gate of the second clock selection circuit and a clock input receiving the second PLL clock signal;

a seventh AND gate of the second clock selection circuit having a first non-inverting input receiving output from the second latch of the second clock selection circuit and a second non-inverting input receiving the second PLL clock signal;

a NAND gate of the second clock selection circuit having a first non-inverting input receiving the first MUX output signal and a second non-inverting input receiving the bypass signal;

an eighth AND gate of the second clock selection circuit having a first non-inverting input receiving output from the seventh AND gate of the second clock selection circuit and a second non-inverting input receiving output from the NAND gate of the second clock selection circuit; and a third OR gate of the second clock selection circuit having a first non-inverting input receiving output from the fourth AND gate of the second clock selection circuit and a second non-inverting input receiving output from the eighth AND gate of the second clock selection circuit, with an output of the third OR gate of the second clock selection circuit being provided to the second clock tree as the third clock signal during the capture phase of the transition mode and the capture phase of the stuck-at mode, and as the second clock signal during the shift phase of the transition mode and the shift phase of the stuck-at mode, passed by the OCC.

7. A method for maintaining a balanced clock signal path when a test select mode signal is at a logic low across different operation modes in an integrated circuit, the method comprising:

outputting first and third clock signals from a phase-locked loop (PLL) circuit and a divider circuit respectively;

when in a functional mode, a capture phase of a transition mode, and a capture phase of a stuck-at mode, routing the first and third clock signals through an on-chip clock controller (OCC) by:

passing the first clock signal through a first sub-path within a first path within a first clock selection circuit such that the first clock signal is passed through less than the entire first path within the first clock selection circuit, the first sub-path within the first path within the first clock selection circuit being a first functional clock path; and passing the third clock signal through a first sub-path within a first path within a second clock selection circuit such that the third clock signal is passed through less than the entire first path within the second clock selection circuit, the first sub-path within the first path within the second clock selection circuit being a second functional clock path; and when in a shift phase of the transition mode and a shift phase of the stuck-at mode, routing a second clock signal through the OCC by:

passing the second clock signal through a second sub-path within a second path within the first clock selection circuit during the shift phase of the transition mode and the shift phase of the stuck-at mode such that the second clock signal is passed through less than the entire second path within the first clock selection circuit, and passing the second clock signal through the first functional clock path during the shift phase of the transition mode and the shift phase of the stuck-at mode; and passing the second clock signal through a second sub-path within a second path within the second clock selection circuit during the shift phase of the transition mode and the shift phase of the stuck-at mode such that the second clock signal is passed through less than the entire second path within the second clock selection circuit, and passing the second clock signal through the second functional clock path during the shift phase of the transition mode and the shift phase of the stuck-at mode;

distributing the first clock signal and second clock signal to a first clock tree after the first clock signal and second clock signal have been routed through the OCC; and distributing the third and second clock signal to a second clock tree after the third and second clock signal has been routed through the OCC.

8. The method of claim 7, wherein the first clock signal is a PLL clock signal generated by the PLL circuit or an Automatic Test Equipment (ATE) clock signal passed through the PLL circuit when a bypass signal is set to a logic one.

9. The method of claim 7, further comprising:

generating the first clock signal as a first PLL clock signal by the PLL circuit during functional mode and during a capture phase of a transition mode and a capture phase of a stuck-at mode;

generating the second clock signal based upon an external Automatic Test Equipment (ATE) clock signal as a second ATE clock signal during the shift phase of the transition mode and the shift phase of the stuck-at mode;

generating the third clock signal as a second PLL clock signal by the divider circuit during functional mode and during the capture phase of the transition mode and the capture phase of the stuck-at mode.

10. A test circuit in an integrated circuit (IC) designed for test, comprising:

a phase-locked loop circuit configured to:

output a first clock signal as a first PLL clock signal during functional mode and during a capture phase of a transition mode, and output the first clock signal as a first automated test equipment (ATE) clock signal during a capture phase of a stuck-at mode; and output a second clock signal, based upon an external ATE clock signal, as a second ATE clock signal during a shift phase of the transition mode and a shift phase of the stuck-at mode;

an on-chip clock controller (OCC) configured to receive the first clock signal and the second clock signal;

wherein the OCC is configured to pass the first clock signal therethrough by:

when in the functional mode, in the capture phase of the transition mode, and the capture phase of the stuck-at mode:

passing the first clock signal through a first sub-path within a first path within a first clock selection circuit in the OCC; and wherein the OCC is configured to pass the second clock signal therethrough by:

when in shift phase of the transition mode and the shift phase of the stuck-at mode:

passing the second clock signal through a second sub-path within a second path within the first clock selection circuit in the OCC during the shift phase of the transition mode and the shift phase of the stuck-at mode.

11. The test circuit of claim 10, wherein the phase-locked loop circuit outputs the first clock signal to a divider, generating a third clock signal as a third PLL clock signal during the functional mode and during the capture phase of the transition mode, and with the divider being bypassed when outputting the third clock signal based upon the external ATE clock signal as the first ATE clock signal during the capture phase of the stuck-at mode;

wherein the OCC is further configured to receive the third clock signal and to pass the third clock signal therethrough;

wherein the OCC is configured to pass the third clock signal therethrough by:

when in the functional mode, the capture phase of the transition mode, and the capture phase of the stuck-at mode, passing the third clock signal through a first sub-path within a first path within a second clock selection circuit in the OCC; and wherein the OCC is configured to pass the second clock signal therethrough by:

when in the shift phase of the transition mode and the shift phase of the stuck-at mode, passing the second clock signal through a second sub-path within a second path within the second clock selection circuit in the OCC during the shift phase of the transition mode and the shift phase of the stuck-at mode.

12. The test circuit of claim 11, wherein the phase-locked loop circuit and divider also generate the first and third clock signals as first and second PLL clock signals during the capture phase of the transition mode, and output the first and third clock signals based upon the external clock signal as the first ATE clock signal during the capture phase of the stuck-at mode.

* * * * *